(12) United States Patent  (10) Patent No.: US 8,815,696 B1
Herner  (45) Date of Patent: Aug. 26, 2014

(54) DISTURB-RESISTANT NON-VOLATILE MEMORY DEVICE USING VIA-FILL AND ETCHBACK TECHNIQUE

(75) Inventor: Scott Brad Herner, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 152 days.

(21) Appl. No.: 13/339,939

(22) Filed: Dec. 29, 2011

Related U.S. Application Data

(60) Provisional application No. 61/428,994, filed on Dec. 31, 2010.

(51) Int. Cl.
  *H01L 21/20* (2006.01)
(52) U.S. Cl.
  USPC .................................. 438/382; 257/E21.613
(58) Field of Classification Search
  USPC .............. 438/382, 658; 257/2, 4, 5, E21.613, 257/E21.614, E21.645; 365/148
  See application file for complete search history.

(56) References Cited

U.S. PATENT DOCUMENTS

| | | |
|---|---|---|
| 680,652 A | 8/1901 | Elden |
| 4,433,468 A | 2/1984 | Kawamata |
| 4,684,972 A | 8/1987 | Owen et al. |
| 4,741,601 A | 5/1988 | Saito |
| 5,139,911 A | 8/1992 | Yagi et al. |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,538,564 A | 7/1996 | Kaschmitter |
| 5,541,869 A | 7/1996 | Rose et al. |
| 5,594,363 A | 1/1997 | Freeman et al. |
| 5,614,756 A | 3/1997 | Forouhi et al. |
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |

(Continued)

FOREIGN PATENT DOCUMENTS

| | | |
|---|---|---|
| JP | 2005-506703 A | 3/2005 |
| JP | 2006-032951 A | 2/2006 |

(Continued)

OTHER PUBLICATIONS

Notice of Allowance for U.S. Appl. No. 13/725,331, dated Jan. 17, 2014.

(Continued)

*Primary Examiner* — Daniel Luke
*Assistant Examiner* — Latanya N Crawford
(74) *Attorney, Agent, or Firm* — Ogawa P.C.

(57) ABSTRACT

A method of forming a disturb-resistant non volatile memory device includes providing a substrate and forming a first dielectric thereon, forming a first strip of material separated from a second strip of material from a first wiring material, and forming a second dielectric thereon to fill a gap between the first and second strips of material. Openings are formed in the second dielectric exposing portions of the first wiring material. Filing the openings by p+ polysilicon contact material, and then an undoped amorphous silicon material, and then a metal material. A second wiring structure is formed thereon to contact the metal material in the openings. Resistive switching cells are formed from the first wiring structure, the second wiring structure, the contact material, the undoped amorphous silicon material, and the metal material.

18 Claims, 13 Drawing Sheets

(56) References Cited

U.S. PATENT DOCUMENTS

| | | |
|---|---|---|
| 5,998,244 A | 12/1999 | Wolstenholme et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,259,116 B1 | 7/2001 | Shannon |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,848,012 B2 | 1/2005 | LeBlanc et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,881,994 B2 | 4/2005 | Lee et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,521,705 B2 | 4/2009 | Liu |
| 7,534,625 B2 | 5/2009 | Karpov et al. |
| 7,550,380 B2 | 6/2009 | Elkins et al. |
| 7,606,059 B2 | 10/2009 | Toda |
| 7,615,439 B1 | 11/2009 | Schricker et al. |
| 7,629,198 B2 | 12/2009 | Kumar et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,972,897 B2 | 7/2011 | Kumar et al. |
| 8,004,882 B2 | 8/2011 | Katti et al. |
| 8,018,760 B2 | 9/2011 | Muraoka et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,207,064 B2 | 6/2012 | Bandyopadhyay et al. |
| 8,227,787 B2 | 7/2012 | Kumar et al. |
| 8,233,308 B2 | 7/2012 | Schricker et al. |
| 8,237,146 B2 | 8/2012 | Kreupl et al. |
| 8,265,136 B2 | 9/2012 | Hong et al. |
| 8,374,018 B2 | 2/2013 | Lu |
| 8,385,100 B2 | 2/2013 | Kau et al. |
| 8,394,670 B2 | 3/2013 | Herner |
| 8,467,227 B1 | 6/2013 | Jo |
| 2003/0174574 A1 | 9/2003 | Perner et al. |
| 2003/0206659 A1 | 11/2003 | Hamanaka |
| 2004/0026682 A1 | 2/2004 | Jiang |
| 2004/0170040 A1 | 9/2004 | Rinerson et al. |
| 2004/0194340 A1 | 10/2004 | Kobayashi |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0175099 A1 | 8/2005 | Sarkijarvi et al. |
| 2006/0017488 A1 | 1/2006 | Hsu |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0185567 A1 | 8/2008 | Kumar et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0003717 A1 | 1/2009 | Sekiguchi et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |

(56) References Cited

U.S. PATENT DOCUMENTS

| | | | |
|---|---|---|---|
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0317470 A1 | 12/2011 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043621 A1 | 2/2012 | Herner |
| 2012/0043654 A1 | 2/2012 | Lu et al. |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0269275 A1 | 10/2012 | Hannuksela |
| 2012/0305874 A1 | 12/2012 | Herner |

FOREIGN PATENT DOCUMENTS

| | | | |
|---|---|---|---|
| JP | 2007-067408 | A | 3/2007 |
| JP | 2007-281208 | A | 10/2007 |
| JP | 2007-328857 | A | 12/2007 |
| KR | 1020110014248 | A | 2/2011 |
| WO | 03/034498 | A1 | 4/2003 |
| WO | WO 2009/005699 | A1 | 1/2009 |

OTHER PUBLICATIONS

Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Office Action for U.S. Appl. No. 12/913,719 dated Feb. 17, 2011.
Office Action for U.S. Appl. No. 12/913,719 dated Jul. 22, 2011.
Notice of Allowance for U.S. Appl. No. 12/913,719 dated Mar. 12, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al, "Aluminum spiking at contact windows in Al/Ti-W/Si", Appl. Phys. Lett., Jan. 25, 1988, pp. 272-274, vol. 52 No. 4, American Institute of Physics.
J. Del Alamo et al, "Operating limits of Al-alloyed high-low junction for BSF solar cells", Solid-State Electronics, 1981, pp. 415-420, vol. 24, Pergamon Press Ltd., Great Britain.
Hao-Chih Yuan et al, "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Office Action for U.S. Appl. No. 12/861,650 dated Oct. 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Office Action of U.S. Appl. No. 13/436,714 dated Dec. 7, 2012.
Notice of Allowance for U.S. Appl. No. 12/814,410 dated Jan. 8, 2013.
Corrected Notice of Allowance for U.S. Appl. No. 12/861,666 dated Jan. 11, 2013.
Supplemental Notice of Allowance for U.S. Appl. No. 12/894,087 dated Jan. 11, 2013.
Notice of Allowance for U.S. Appl. No. 13/314,513 dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264 dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432 dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312 filed on Jul. 2, 2012.
Office Action for U.S. Appl. No. 13/466,008, dated Jul. 29, 2013.
Russo, Ugo et al., "Self-Accelerated Thermal Dissolution Model for Reset Programming in Unipolar Resistive-Switching Memory

(56) References Cited

OTHER PUBLICATIONS (RRAM) Devices", IEEE Transactions on Electron Devices, Feb. 2009, pp. 193-200, vol. 56, No. 2.
Cagli, C. et al., "Evidence for threshold switching in the set process of NiO-based RRAM and physical modeling for set, reset, retention and disturb prediction", IEEE International Electron Devices Meeting, Dec. 15-17, 2008, pp. 1-4, San Francisco, CA.
Office Action for U.S. Appl. No. 13/077,941, dated Aug. 12, 2013.
Office Action of U.S. Appl. No. 13/436,714 dated Aug. 27, 2013.
Notice of Allowance for U.S. Appl. No. 13/679,976, dated Sep. 17, 2013.
Office Action for U.S. Appl. No. 13/189,401 dated Sep. 30, 2013.
Office Action for U.S. Appl. No. 13/462,653 dated Sep. 30, 2013.
Corrected Notice of Allowability for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665 dated Aug. 2, 2013.
Notice of Allowance for U.S. Appl. No. 13/769,152, dated Oct. 8, 2013.
Notice of Allowance for U.S. Appl. No. 13/905,074, dated Oct. 8, 2013.
Notice of Allowability for U.S. Appl. No. 13/452,657, dated Oct. 10, 2013.
Notice of Allowance for U.S. Appl. No. 13/174,264, dated Oct. 16, 2013.
Notice of Allowability for U.S. Appl. No. 13/417,135, dated Oct. 23, 2013.
Jian Hu et al., "Area-Dependent Switching in Thin Film-Silicon Devices", Materials Research Society, Mal. Res. Soc. Symp Proc., 2003, pp. A18.3.1-A18.3.6, vol. 762.
André Dehon, "Array-Based Architecture for FET-Based, Nanoscale Electronics", IEEE Transactions on Nanotechnology, Mar. 2003, pp. 23-32, vol. 2, No. 1, IEEE.
Herb Goronkin et al., "High-Performance Emerging Solid-State Memory Technologies", MRS Bulletin, www.mrs.org/publications/bulletin, Nov. 2004, pp. 805-813.
Gerhard Müller et al., "Status and Outlook of Emerging Nonvolatile Memory Technologies", IEEE, 2004, pp. 567-570.
A.E. Owen et al., "Memory Switching in Amorphous Silicon Devices", Journal of Non-Crystalline Solids 59 & 60,1983, pp. 1273-1280, North Holland Publishing Company/Physical Society of Japan.
J. Campbell Scott, "Is There an Immortal Memory?", www.sciencemag.org, Apr. 2, 2004, pp. 62-63, vol. 304 No. 5667, American Association for the Advancement of Science.
S.H. Lee et al., "Full Integration and Cell Characteristics for 64Mb Nonvolatile PRAM", 2004 Symposium on VLSI Technology Digest of Technical Papers, IEEE, 2004, pp. 20-21.
Stephen Y. Chou et al., "Imprint Lithography With 25-Nanometer Resolution", Science, Apr. 5, 1996, pp. 85-87, vol. 272, American Association for the Advancement of Science.
S. Zankovych et al., "Nanoimprint Lithography: challenges and prospects", Nanotechnology, 2001, pp. 91-95, vol. 12, Institute of Physics Publishing.
A. Avila et al., "Switching in coplanar amorphous hydrogenated silicon devices", Solid-State Electronics, 2000, pp. 17-27, vol. 44, Elsevier Science Ltd.
Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.
S. Hudgens et al., "Overview of Phase-Change Chalcogenide Nonvolatile Memory Technology", MRS Bulletin, www.mrs.org/publications/bulletin, Nov. 2004, pp. 829-832.
K. Terabe et al., "Quantized conductance atomic switch", Nature, www.nature.com/nature, Jan. 6, 2005, pp. 47-50, vol. 433, Nature Publishing Group.

Michael Kund et al., "Conductive bridging RAM (CBRAM): An emerging non-volatile memory technology scalable to sub 20nm", IEEE, 2005.
W. Den Boer, "Threshold switching in hydrogenated amorphous silicon", Appl. Phys. Letter, 1982, pp. 812-813, vol. 40, American Institute of Physics.
P.G. Lecomber et al., "The Switching Mechanism in Amorphous Silicon Junctions", Journal of Non-Crystalline Solids,1985, pp. 1373-1382, vol. 77 & 78, Elsevier Science Publishers B.V., North Holland Physics Publishing Division, North-Holland, Amsterdam.
A. E. Owen et al., "Switching in amorphous devices", Int. J. Electronics, 1992, pp. 897-906, vol. 73, No. 5, Taylor and Francis Ltd.
M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jong Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/0400900 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, pp. 1-4.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, pubs.acs.org/NanoLett, pp. A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.

(56) References Cited

OTHER PUBLICATIONS

Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.

Sung Hyun Jo et al., "Experimental, Modeling and Simulation Studies of Nanoscale Resistance Switching Devices", 9th Conference on Nanotechnology, IEEE, 2009, pp. 493-495.

Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.

Sung Hyun Jo et al., "Si Memristive Devices Applied to Memory and Neuromorphic Circuits", Proceedings of 2010 IEEE International Symposium on Circuits and Systems, 2010, pp. 13-16.

Wei Lu et al., "Supporting Information", 2008.

Sung Hyun Jo et al., "High-Density Crossbar Arrays Based on a Si Memristive System", Nano Letters, 2009, pp. 870-874, vol. 9 No. 2, American Chemical Society Publications.

Sung Hyun Jo et al., "High-Density Crossbar Arrays Based on a Si Memristive System", Supporting Information, 2009, pp. 1-4.

Sung Hyun Jo et al., "Programmable Resistance Switching in Nanoscale Two-Terminal Devices", Nano Letters, 2009, pp. 496-500, vol. 9 No. 1, American Chemical Society Publications.

Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.

S. K. Dey, "Electrothermal model of switching in amorphous silicon films", J. Vac. Sci. Technol., Jan./Feb. 1980, pp. 445-448, vol. 17, No. 1, American Vacuum Society.

J. Hajto et al., "The Programmability of Amorphous Silicon Analogue Memory Elements", Mat. Res. Soc. Symp. Proc., 1990, pp. 405-410, vol. 192, Materials Research Society.

M. J. Rose et al., "Amorphous Silicon Analogue Memory Devices", Journal of Non-Crystalline Solids, 1989, pp. 168-170, vol. 115, Elsevier Science Publishers B.V., North-Holland.

A. Moopenn et al., "Programmable Synaptic Devices for Electronic Neural Nets", Control and Computers, 1990, pp. 37-41, vol. 18 No. 2.

P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.

J. Hu, et al., "AC Characteristics of Cr/p+a-Si:H/V Analog Switching Devices", IEEE Transactions on Electron Devices, Sep. 2000, pp. 1751-1757, vol. 47 No. 9, IEEE.

A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.

J. Hajto et al., "Electronic Switching in Amorphous-Semiconductor Thin Films", Chapter 14, pp. 640-701.

J. Hajto et al., "Analogue memory and ballistic electron effects in metal-amorphous silicon structures", Philosophical Magazine B, 1991, pp. 349-369, vol. 63 No. 1, Taylor & Francis Ltd.

A. J. Holmes et al., "Design of Analogue Synapse Circuits using Non-Volatile a-Si:H Memory Devices", pp. 351-354.

Yajie Dong et al., "Si/a-Si Core/Shell Nanowires as Nonvolatile Crossbar Switches", Nano Letters, Jan. 2008, pp. 386-391, vol. 8 No. 2, American Chemical Society.

European Search Report for Application No. EP 09 81 9890.6 of Mar. 27, 2012.

D. A. Muller et al., "The Electronic structure at the atomic scale of ultrathin gate oxides", Nature, Jun. 24, 1999, pp. 758-761, vol. 399.

J. Suñé et al., "Nondestructive multiple breakdown events in very thin $SiO_2$ films", Applied Physics Letters, 1989, pp. 128-130, vol. 55.

Herve Marand et al., MESc. 5025 lecture notes: Chapter 7. Diffusion, University of Vermont, http://www.files.chem.vt.edu/chem-dept/marand/MEScchap6-1c.pdf.

A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.

Sung Hyun Jo, "Nanoscale Memristive Devices for Memory and Logic Applications", Ph. D dissertation, University of Michigan, 2010.

Office Action for U.S. Appl. No. 12/894,098 dated Aug. 1, 2012.

Sung Hyun Jo et al., "CMOS Compatible Nanoscale Nonvolatile Resistance Switching Memory", Nano Letters, 2008, pp. 392-397, vol. 8, No. 2.

Office Action for U.S. Appl. No. 12/582,086 dated Apr. 19, 2011.

Office Action for U.S. Appl. No. 12/582,086 dated Sep. 6, 2011.

Notice of Allowance for U.S. Appl. No. 12/582,086 dated Oct. 21, 2011.

International Search Report for PCT/US2009/061249 filed on Oct. 20, 2009.

Written Opinion of the International Searching Authority for PCT/US2009/061249 filed on Oct. 20, 2009.

Notice of Allowance for U.S. Appl. No. 12/939,824 dated Jul. 24, 2012.

Office Action for Application No. EP 1100 5207.3 dated Aug. 8, 2012.

International Search Report and Written Opinion for PCT/US2013/077628, filed on Dec. 23, 2013.

Office Action for U.S. Appl. No. 13/143,047, dated Apr. 11, 2014.

Office Action for U.S. Appl. No. 13/761,132, dated Apr. 25, 2014.

DISTURB-RESISTANT NON-VOLATILE MEMORY DEVICE USING VIA-FILL AND ETCHBACK TECHNIQUE

CROSS REFERENCE TO RELATED APPLICATIONS

This application claims priority to provisional application 61/428,994 filed Dec. 31, 2010, commonly assigned, and incorporated by reference in its entirety herein.

BACKGROUND

The present invention is generally related to resistive switching devices. More particularly, embodiments according to the present invention provide a method and a structure for forming a resistive switching device. The present invention can be applied to non-volatile memory devices but it should be recognized that the present invention can have a much broader range of applicability The success of semiconductor devices has been mainly driven by an intensive transistor down-scaling process. However, as field effect transistors (FET) approach sizes less than 100 nm, problems such as short channel effect can degrade device performance. Moreover, such sub 100 nm device size can lead to sub-threshold slope non-scaling and also increases power dissipation. It is generally believed that transistor-based memories such as those commonly known as Flash may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, Fe-RAM and MRAM devices have fast switching characteristics and good programming endurance, but their fabrication is not CMOS compatible and size is usually large. Power dissipation during switching for a PCRAM device is usually large. Organic RAM or ORAM is incompatible with large volume silicon-based fabrication and device reliability is usually poor.

From the above, a new semiconductor device structure and integration is desirable.

BRIEF SUMMARY OF THE PRESENT INVENTION

The present invention is directed to switching devices. More particularly, embodiments according to the present invention provide a method and a structure to form an array of switching devices. The present invention has been applied to forming a disturb-resistant non-volatile memory device using an amorphous silicon switching material. But it should be recognized that embodiments of the present invention can be applied to other devices.

In a specific embodiment, a method of forming a disturb-resistant non-volatile memory device is provided. The method includes providing a substrate having a surface region and forming a first dielectric material overlying the surface region of the semiconductor substrate. A first wiring material is deposited overlying the first dielectric material and a contact material is formed overlying the first wiring material. In a specific embodiment, the contact material includes doped polysilicon material. The method subjects the first wiring material and the contact material to a first patterning and etching process to separating a first strip of material from a second strip of material. In a specific embodiment, each of the first strip of material and the second strip of material include the first wiring material and the contact material. The first strip of material and the second strip of material are spatially oriented in a first direction in a specific embodiment. The method includes forming a thickness of a second dielectric material overlying the first strip of material, the second strip of material, and filling a gap region between the first strip of material and the second strip of material. In a specific embodiment, the method forms a first opening and a second opening in a portion of the thickness of the second dielectric material overlying the first strip of material, and forming a third opening and a fourth opening in a portion of the thickness of the second dielectric material overlying the second strip of material, and exposing a surface region of the contact material. A switching material comprising an amorphous silicon material is deposited overlying the thickness of second dielectric material and to at least partially fill each of the first opening, the second opening, the third opening, and the fourth opening. In a specific embodiment, the method subjects the switching material to an etch back process to remove the switching material overlying the second dielectric material while maintaining the switching material in each of the first opening, the second opening, the third opening, and the fourth opening. A second wiring material is formed overlying the switching material in each of the first opening, the second opening, the third opening, and the fourth opening in a specific embodiment.

In a specific embodiment, a method of forming a disturb-resistant non volatile memory device is provided. The method includes providing a first cell and a second cell. The first cell is formed from a first wiring structure, a second wiring structure, a switching material, and a contact material sandwiched between the first wiring structure and the second wiring structure. In a specific embodiment, the first wiring structure is spatially configured to extend in a first direction and the second wiring structure is spatially configured to extend in a second direction orthogonal to the first direction in a specific embodiment. In a specific embodiment, the switching material includes an amorphous silicon material, and the contact material can be a p+ polysilicon material. A first switching region formed in an intersecting region between the first wiring structure and the second wiring structure. The second cell is formed from the first wiring structure, the switching material, the contact material, and a third wiring structure. The third wiring structure is parallel to the second wiring structure. A second switching region is formed in an intersecting region between the first wiring structure and the third wiring structure. In a specific embodiment, at least the switching material and the contact material forms a coupling between the first cell and the second cell In a specific embodiment, the coupling is eliminated coupling by disposing the switching material in a first via opening associated with the first cell and in a second via opening associated with the second cell. The first via opening and the second via opening are isolated using a dielectric material to electrically and physically isolate the first switching region and the second switching region.

In a specific embodiment, a non-volatile memory device is provided. The device includes a substrate having a surface region and a first dielectric material overlying the surface region of the semiconductor substrate. The device includes at least a first cell and a second cell. In a specific embodiment, the first cell includes a first wiring structure extending in a first direction overlying the first dielectric material. A first contact region overlies the first wiring structure and a first switching region overlies the first contact region. The first contact region includes a p+ polysilicon material and the first switching region includes an amorphous silicon material in a specific embodiment. The first cell includes a second wiring structure extending in a second direction orthogonal to the first direction overlying the switching region. The second cell includes a second contact region comprising the p+ polysilicon material overlying the first wiring structure. A second switching region comprising the amorphous silicon material overlies the second contact region. The second cell includes a third wiring structure overlying the second switching region. The third wiring structure is separated from the second wiring structure and parallel to the second wiring structure. In a specific embodiment, a dielectric material is disposed at least in a region between the first switching region and the second switching region to electrically and physically isolate the first switching region and the second switching region. In other embodiment, the dielectric material is further disposed between a first region between the first contact region and the second contact region to further electrically and physically isolate the first contact region and the second region.

Many benefits can be achieved by ways of present invention. The present invention uses convention CMOS fabrication techniques to form a disturb resistant non-volatile memory array. Embodiments according to the present invention further provide an array of interconnected switching devices to be used in a high density memory device. Depending on the embodiment, one or more of these benefits can be achieved. One skilled in the art would recognize other variations, modifications, and alternatives.

DETAILED DESCRIPTION OF THE PRESENT INVENTION

The present invention is generally related to switching devices. More particularly, embodiments according to the present invention provide a method and a structure to form an array of switching devices. Various embodiments according to the present invention have been applied to forming a disturb-resistant non-volatile memory device using an amorphous silicon switching material. But it should be recognized that embodiments of the present invention can be have other much broader range of applicability.

Figure 1:
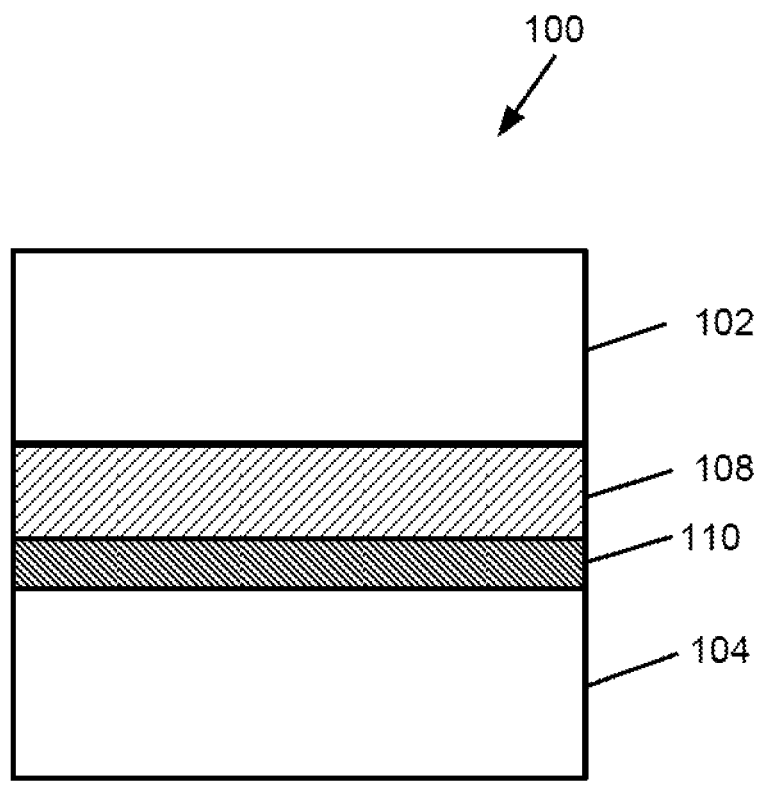
FIG. 1 is a simplified diagram illustrating a resistive switching device according to an embodiment of the present invention.

FIG. 1 is a simplified diagram illustrating a cross section of a resistive switching device 100. The resistive switching device includes a top wiring structure 102, a bottom wiring structure 104 and a switching element 108 disposed between the top wiring structure and the bottom wiring structure. In a crossbar array, the top electrode and the bottom electrode are arranged orthogonal to each other to form a highly interconnected structure. In this implementation, the top wiring structure and the bottom wiring structure can have a portion including a conductor material such as tungsten, copper, or aluminum that are commonly used in CMOS processing. The top wiring structure further includes a metal material in contact with the switching element. For a switching element using an amorphous silicon material, the metal material can be silver or other suitable metal materials. Other suitable metal materials can include gold, platinum, palladium, nickel, aluminum, and others, depending on the application. The silver material can be formed in a via structure connecting the amorphous silicon switching material to other portion of the top wiring structure. Again, for an amorphous silicon switching material, the bottom electrode can include a buffer layer 110 between the bottom wiring material and the switching material to provide desirable switching characteristics upon application of a voltage or a current to the top electrode or the bottom electrode. The buffer layer can be a doped silicon material such as a p+ doped polysilicon in a specific embodiment.

Figure 2:
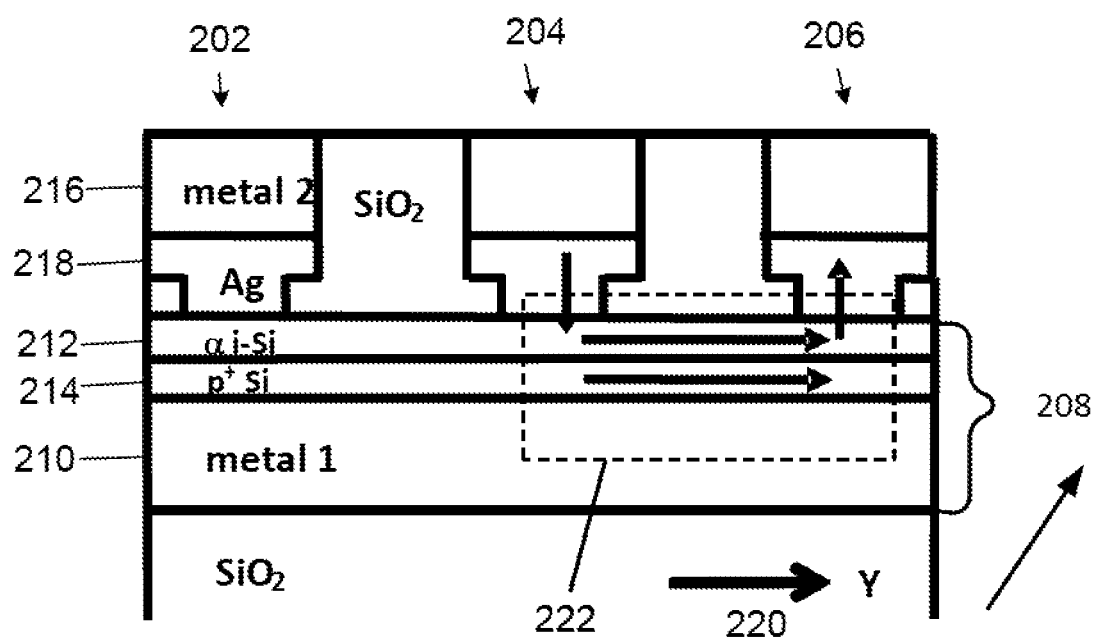
FIG. 2 is a simplified diagram illustrating a conventional method of fabricating an array of switching devices.

FIG. 2 illustrates three interconnected switching devices 202, 204, and 206 initially developed by the assignee of the present invention. As shown, each of the switching devices has a bottom stack 208 including a bottom electrode 210, amorphous silicon layer 212 and p+ polysilicon layer 214 disposed in a first direction 220. The top electrode 216 including silver material 218 is formed orthogonal to the bottom stack. In certain implementation, silver material 218 is disposed in a via structure in direct contact with the amorphous silicon material. For this interconnected structure, the inventor of the present invention determined that a parasitic leakage path 222 can form between adjacent cells in the first direction 220 during read, write, or erase cycles and cause cross-talk between adjacent cells or interconnected cells, as shown.

Embodiments of the present invention provide a method and a structure to form a non-volatile memory device having a silver/amorphous silicon material/bottom electrode configuration. The present method and structure provide a device that is more resistant to cross talk or disturb between adjacent cells during programming in a specific embodiment.

Figure 3:
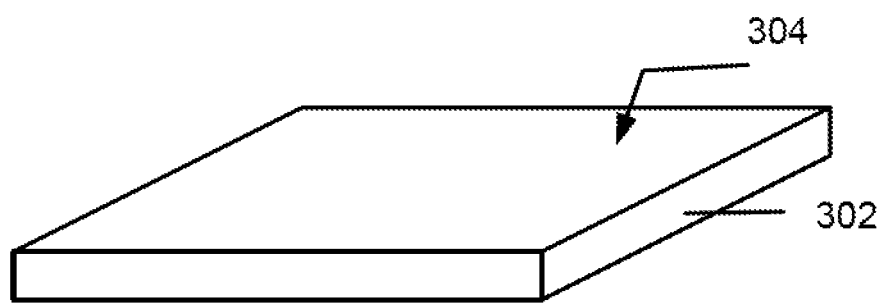
FIGS. 3-14a are simplified diagrams illustrating a method of forming a disturb-resistant memory device according to an embodiment of the present invention.

FIGS. 3-12 are simplified diagrams illustrating a method of forming a non-volatile memory device according to embodiments of the present invention. As shown in FIG. 3, the method includes a semiconductor substrate 302 having a surface region 304. The semiconductor substrate can be a silicon material, a silicon germanium substrate, silicon on insulator substrate, or others, depending on the application. In a specific embodiment, the substrate can also include one or more transistor devices formed thereon. The one or more transistor devices are operably coupled to the memory devices and control the memory devices in certain embodiment.

Figure 4:
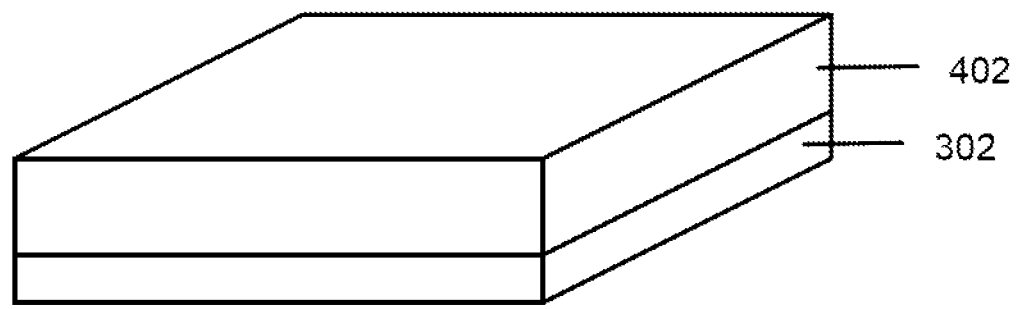

The method includes forming a first dielectric material 402 overlying the surface region of the substrate as shown in FIG. 4. The first dielectric material can be silicon dioxide, silicon nitride, low K dielectric, or a dielectric stack such as silicon oxide on silicon nitride on silicon oxide, commonly known as ONO, depending on the application. The first dielectric material can be formed using techniques such as chemical vapor deposition; including plasma enhanced chemical vapor deposition, physical vapor deposition or a combination depending on the application.

Figure 5:
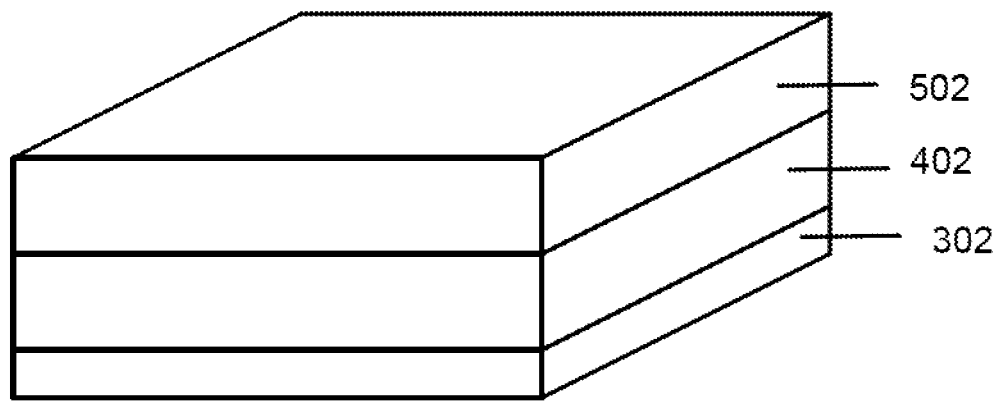

Referring to FIG. 5, the method includes forming a first wiring material 502 overlying the first dielectric material. The first wiring material can include common metal materials used in CMOS processing, such as tungsten, copper, or aluminum, and others. The first wiring material can further include one or more adhesion layer or diffusion barrier layer between the metal material and the first dielectric layer in a specific embodiment. The adhesion layer or diffusion barrier layer can be titanium, titanium nitride, tungsten nitride, titanium tungsten, or others depending on the embodiment.

Figure 6:
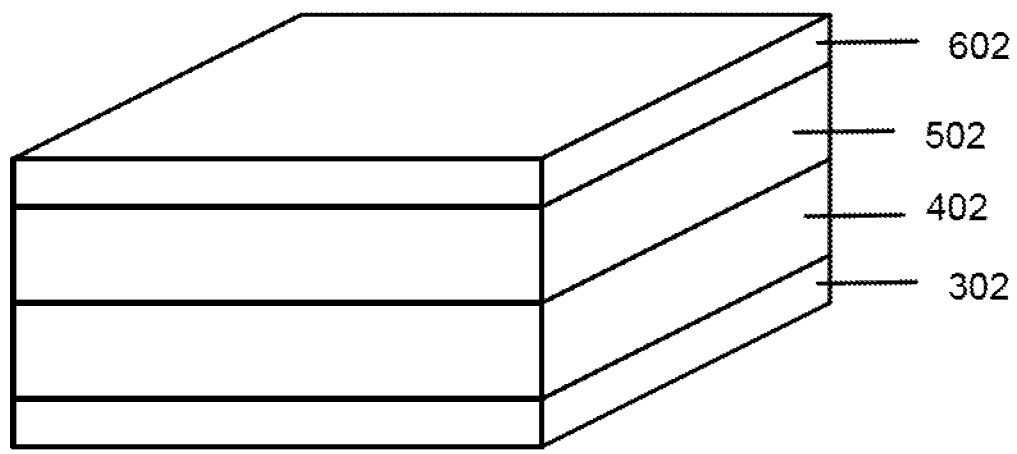

As shown in FIG. 6, the method includes depositing a contact material 602 comprising a silicon material overlying the first wiring material. The silicon material can be a p+ polysilicon material in a specific embodiment. The p+ polysilicon material can be deposited using techniques such as chemical vapor deposition and precursor such as silane, disilane, or a suitable chlorosilane, and boron as a dopant in a specific embodiment. Deposition temperature can range from about 250 Degree Celsius to about 750 Degree Celsius depending on the process and precursors used. In certain embodiments, the deposition temperature can range from about 300 Degree Celsius to about 400 Degree Celsius. Depending on the application, the contact material can be optional.

Figure 7:
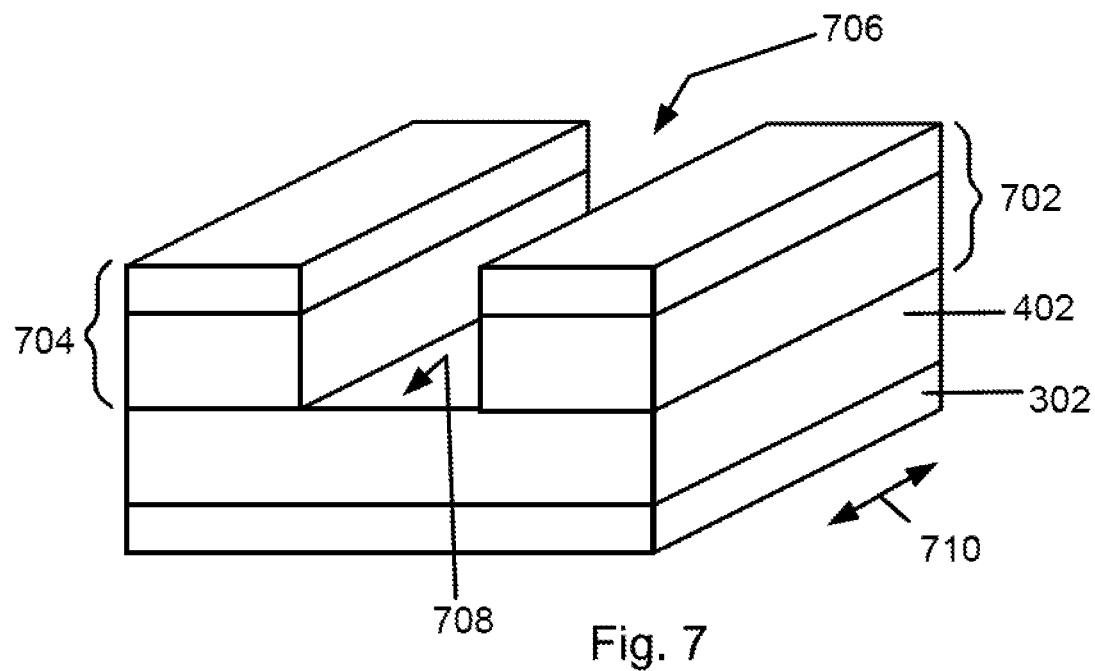

As illustrated in FIG. 7, the method includes subjecting the contact material and the first wiring material to a first patterning and etching process to form a plurality of strips of material including a first strip of material 702 and a second strip of material 704 separated by a first void region 706 and exposing a surface region 708 of the first dielectric material. In a specific embodiment, each of the plurality of strips of material are spatially disposed in a first direction 710.

Figure 8:
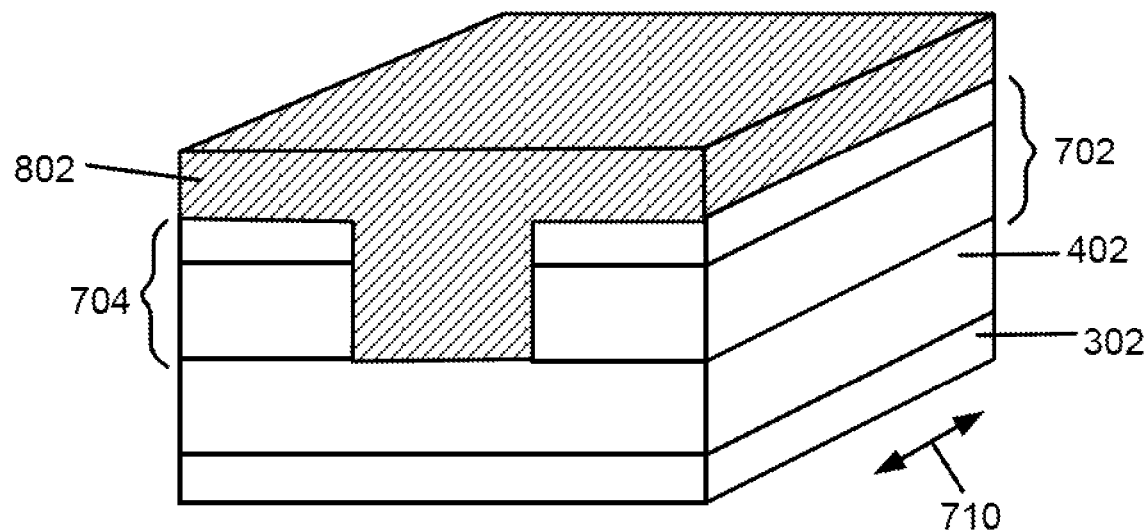

Referring to FIG. 8, the method includes depositing a thickness of a second dielectric material 802 overlying each of the plurality of strips of material and filling the void regions. In a specific embodiment, the second dielectric material can be the same as the first dielectric material and can include silicon dioxide, silicon nitride, low K dielectric, or a dielectric stack such as silicon oxide on silicon nitride on silicon oxide, commonly known as ONO, depending on the application. The second dielectric material can be formed using techniques such as chemical vapor deposition; including plasma enhanced chemical vapor deposition, physical vapor deposition or a combination. One skilled in the art would recognize other variations, modifications, and alternatives.

Figure 9:
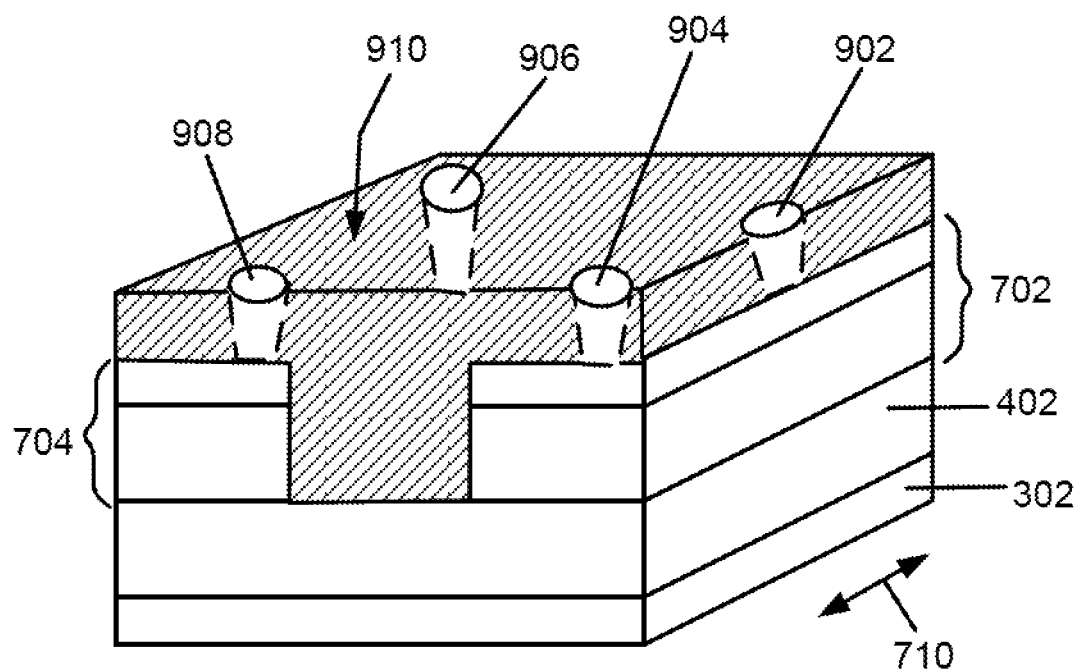

Referring to FIG. 9, the method includes subjecting the second dielectric material to a second pattering and etching process to form a plurality of via openings in a portion of the second dielectric material. As shown a first opening 902 and a second via opening 904 overly the first strip of material to expose a surface region of the contact material in the first strip of material. A third opening 906 and a fourth via opening 908 overly the second strip of material to expose a surface region of the contact material in second first strip of material. A surface region 910 of the second dielectric material is shown.

Figure 10:
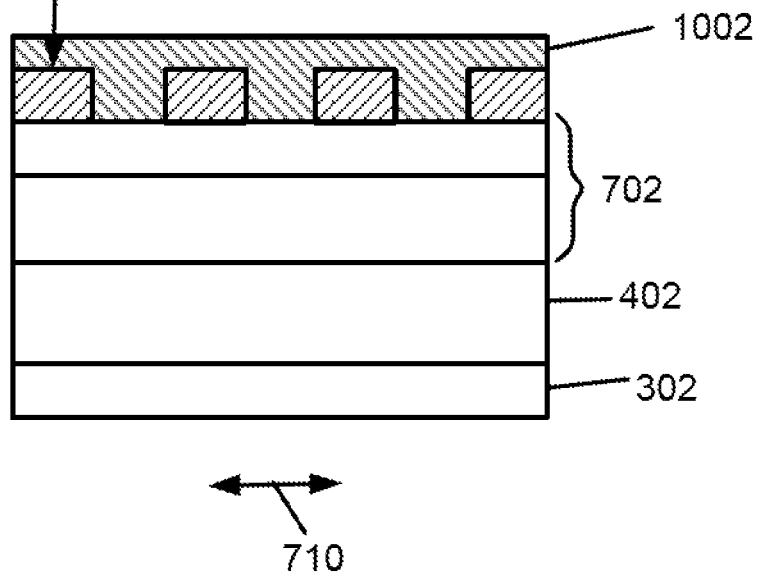

Referring to FIG. 10, the method includes depositing a switching material 1002 to at least partially fill each of the plurality of via openings (for example, first via opening 902, second via opening 904, third via opening 906, and fourth via opening 908) and overlying surface region 910 of the second dielectric material. A cross section view from direction 710 is shown in FIG. 10. Switching material 1002 includes an amorphous silicon material in a specific embodiment. The amorphous silicon material has an intrinsic semiconductor characteristic and further characterized by an electrical resistance depending on a voltage applied to the device. The amorphous silicon material can be deposited using techniques such as chemical vapor deposition and precursor such as silane, disilane, or a suitable chlorosilane in a specific embodiment. Deposition temperature is usually maintained between 250 Degree Celsius to about 500 Degree Celsius depending on the embodiment. In various embodiments, the amorphous silicon is also referred to as non-crystalline silicon (nc-Si). nc-Si non-volatile resistive switching devices may be fabricated using existing CMOS technologies. In an exemplary process, a mixture of silane ($SiH_4$)(45 sccm) and Helium (He) (500 sccm) is used to form an a-Si layer with a deposition rate of 80 nm per minute (T=260° C., P=600 mTorr) during PECVD. In another exemplary process, a mixture of silane ($SiH_4$)(190 sccm) and Helium (He) (100 sccm) is used to form an a-Si layer with a deposition rate of 2.8 A per second (T=380° C., P=2.2 Torr) during PECVD. In another exemplary process, silane ($SiH_4$ 80 sccm) or disilane is used to form an a-Si layer with a deposition rate of 2.8 nm per minute (T=585° C., P=100 mTorr) during LPCVD. Portions of poly-silicon grains may form during the LPCVD process and result in an amorphous-poly silicon film. In various embodiments, no p-type, n-type, or metallic impurities are intentionally added to the deposition chamber while forming the amorphous silicon material. Accordingly, when deposited, the amorphous silicon material is substantially free of any p-type, n-type or metallic dopants, i.e. the amorphous silicon material is undoped. In a specific embodiment, the p+ polysilicon material prevents an interfacial region to form between the amorphous silicon material and the first conductor material. The interface region can have excessive defect sites, which trap conductive particles, including charges, affecting proper switching.

Figure 11:
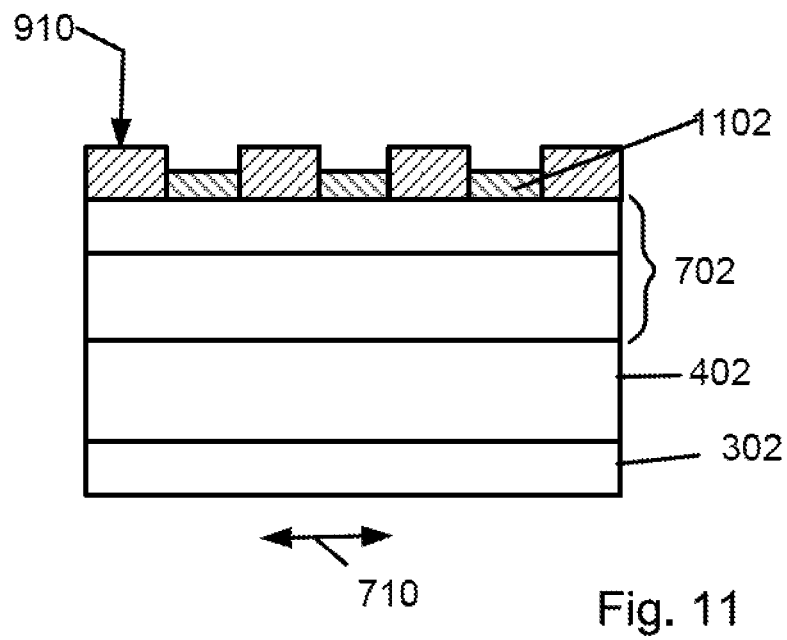

In a specific embodiment, the method includes subjecting switching material 1002 to an etch back process to remove the switching material from the surface region of the second dielectric material, while the switching material is maintained in a portion 1102 of the each of the via openings in contact with the contact material as shown in FIG. 11. Depending on the application, the etch back process can be a reactive ion etch process in a plasma environment and stops at the surface region of the second dielectric material. Alternatively, the switching material may be subjected to a chemical mechanical polishing process to remove the switching material from the surface region of the second dielectric material while maintaining the switching material in the via opening in contact with the contact material in a specific embodiment. The chemical mechanical polishing process preferably selectively removes the switching material from the surface region of the second dielectric material in a specific embodiment. In other embodiments, a combination of etch back process and chemical mechanical polishing process may be used. One skilled in the art would recognize other modifications, variations, and alternatives.

Figure 12:
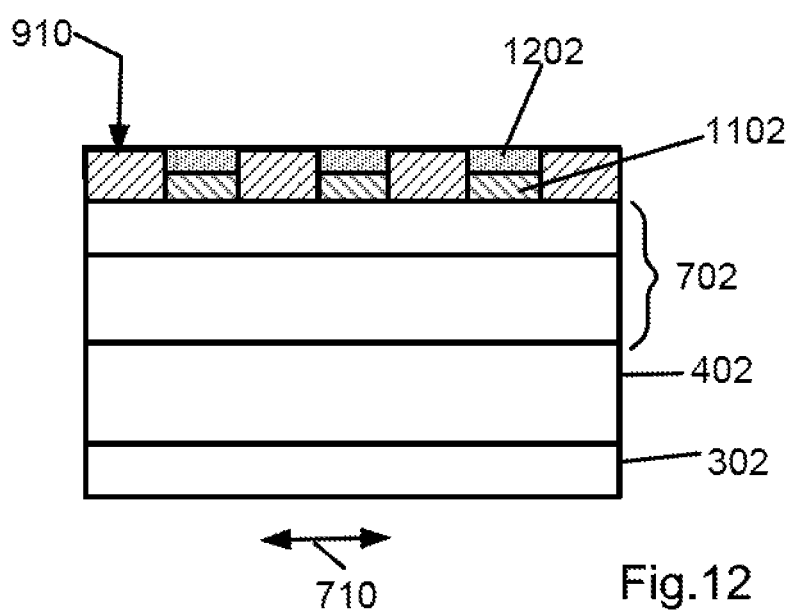
Figure 13:
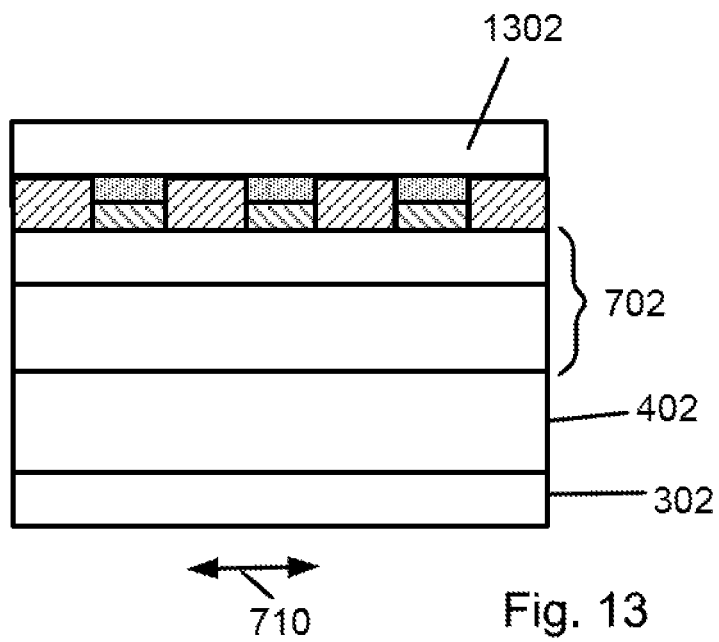

Referring now to FIG. 12, the method includes depositing a metal material 1202 overlying the switching material in each of the plurality of via openings. As shown, the metal material 1202 is selectively formed in a portion of the via opening overlying the switching material while the surface region of the second dielectric material is free of the metal material. In a specific embodiment, the metal material at least partially fills each of the plurality of via openings to form a contact region with the switching material in a specific embodiment. In other embodiments, a thin insulating layer (e.g. oxide) is formed prior to the deposition of the metal (e.g. silver) material on top of the undoped amorphous silicon switching material. This interposing thin insulating layer may be naturally or specifically grown or formed, and one or more etch operations (e.g. HF etch, Argon etch) may help control the thickness of this insulating layer. In some embodiments, a thickness of an insulating oxide, prior to deposition of the metal material 1202 may range from about 20 angstroms to about 50 angstroms; in other embodiments, the thickness may range from about 30 angstroms to about 40 angstroms; or the like.

The metal material is selected to have a suitable diffusion characteristic in the presence of an electric field in the amorphous silicon material in a specific embodiment. Depending on the application, the metal material can be silver, gold, platinum, palladium, nickel, aluminum, and others. In a specific embodiment, the metal material is a silver material. A second wiring material 1302 is deposited overlying the metal material. The second wiring material can be a conductor material used in CMOS fabrication. Examples of the conductor material are copper, aluminum, tungsten, including a combination, depending on the embodiment.

In a specific embodiment, the second wiring material is subjected to a third pattern and etch process to form a second wiring structure 1402. Second wiring structure includes metal material 1202 in a specific embodiment. Second wiring structure 1402 is configured to orient in a second direction 1404 at an angle to the first direction and preferably orthogonal to the first direction in a specific embodiment.

In a specific embodiment, the method forms a third dielectric material 1406 overlying the second wiring structure and fills the gaps between the second wiring structures 1402 to isolate the second wiring structures in a specific embodiment.

Figure 14:
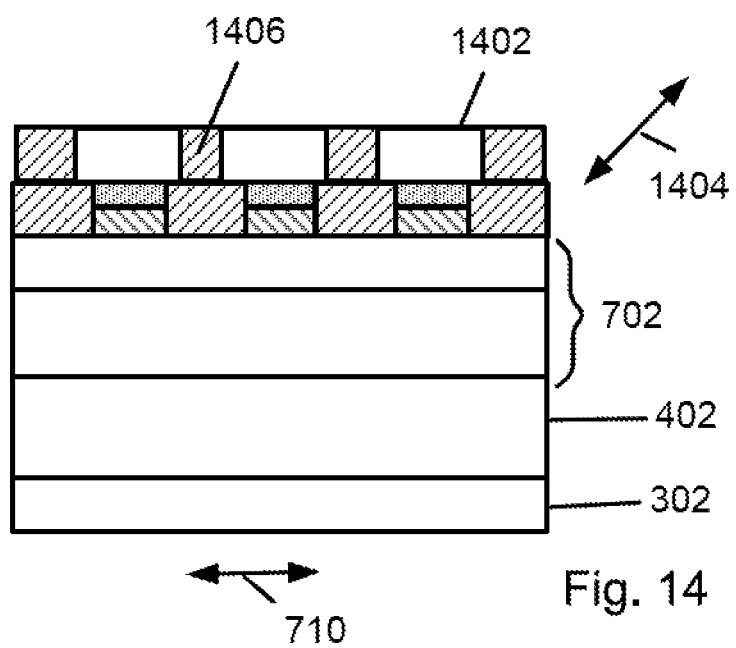
Figure 14A:
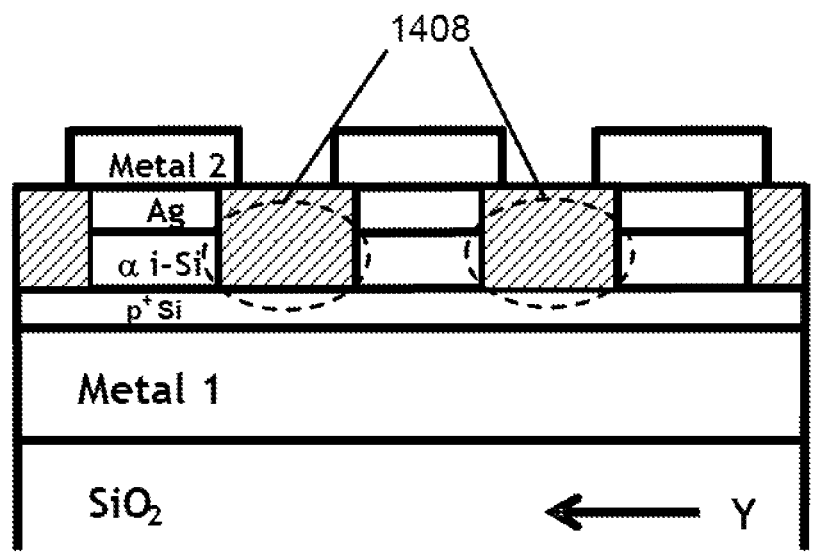

Referring now to FIG. 14*a*, a cross sectional view of the non-volatile memory device in the second direction is shown. As shown, the amorphous silicon switching elements are insulated from a neighboring switching element by portions 1408 of the second dielectric material, preventing disturb during operations between neighboring devices in a specific embodiment.

Figure 15:
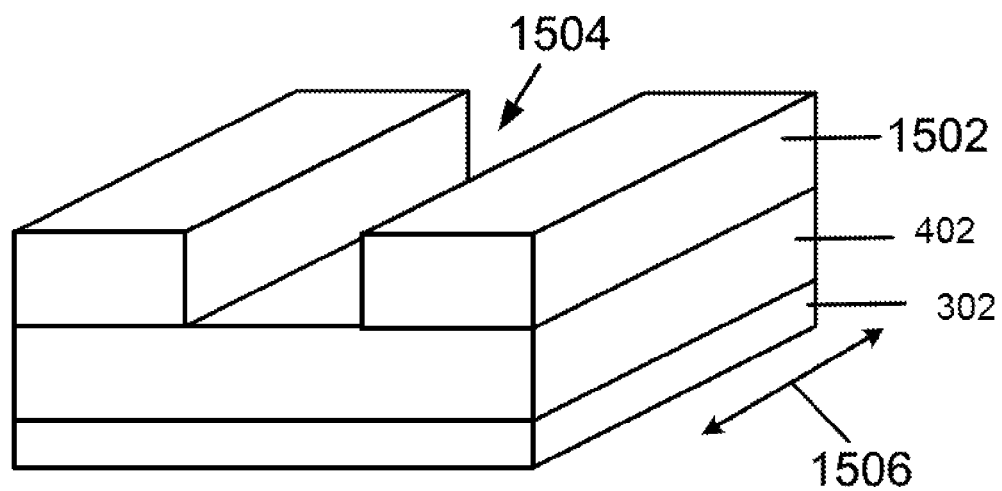
FIG. 15-22 are simplified diagrams illustrating an alternative method of forming a disturb-resistant memory device according to an embodiment of the present invention.
Figure 16:
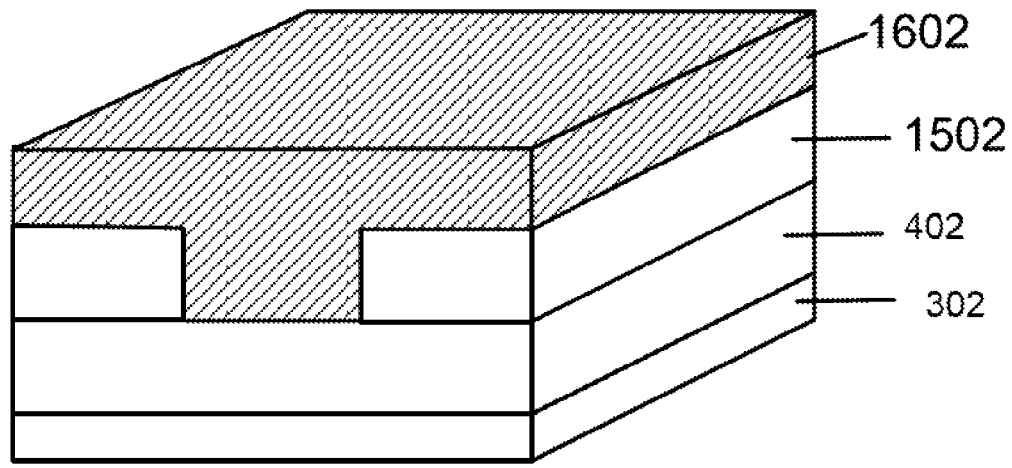
Figure 17:
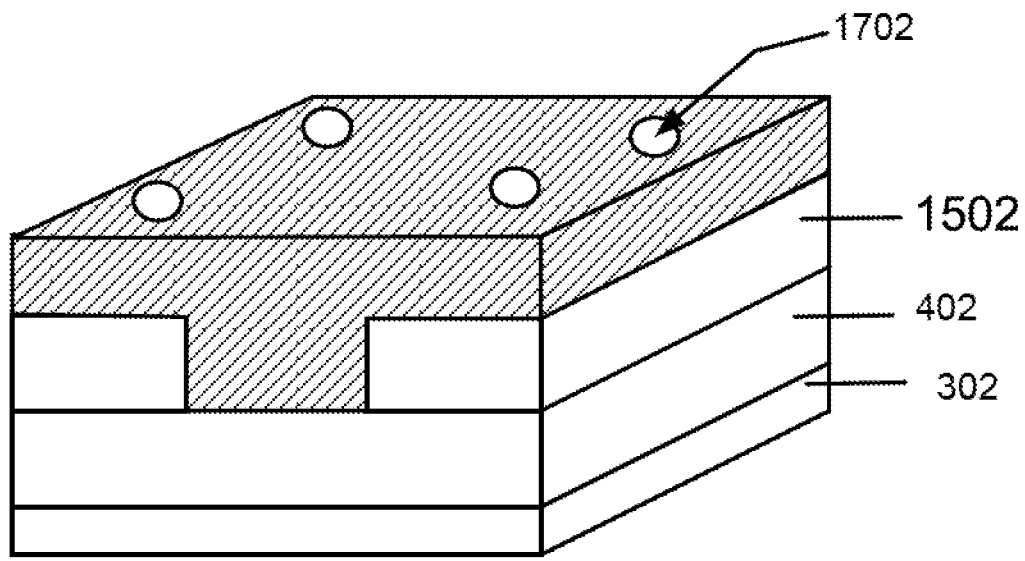
Figure 18:
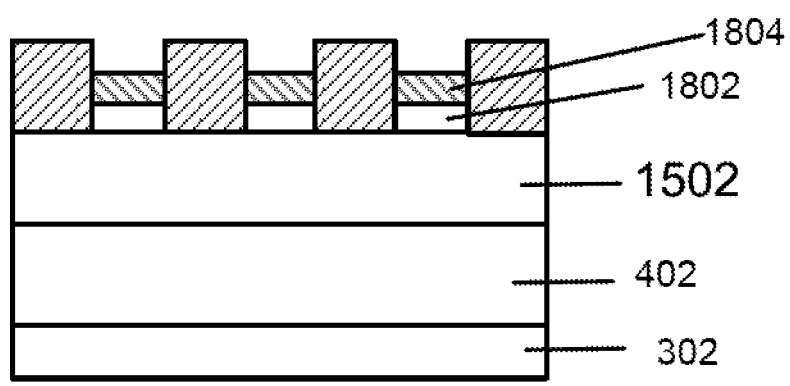

Depending on the embodiment, there can be other variations as illustrated in FIGS. 15-21. For example, the first wiring material can be subjected to a patterning and etching process to form a first wiring structure 1502 separated by gap region 1504 and configured to extend in first direction 1506 as shown in FIG. 15. A second dielectric material 1602 is formed overlying the first wiring structure and fill the gap region to isolate the first wiring structure as shown in FIG. 16. A plurality of via openings 1702 are formed in portions of the second dielectric material to expose a surface region of the first wiring structure. The contact material, for example p+ polysilicon material 1802 is formed in the via openings followed by an undoped amorphous silicon material 1804 (as was described above) as illustrated in FIG. 18. The amorphous silicon material and the polysilicon material are removed from the surface region of the second dielectric material by an etch back process or a chemical mechanical process including a combination, while the amorphous silicon material and the polysilicon material remain in the via opening in a specific embodiment.

Figure 19:
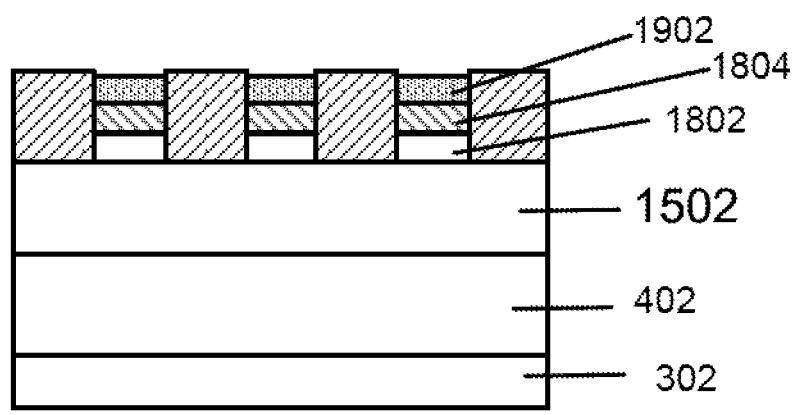
Figure 20:
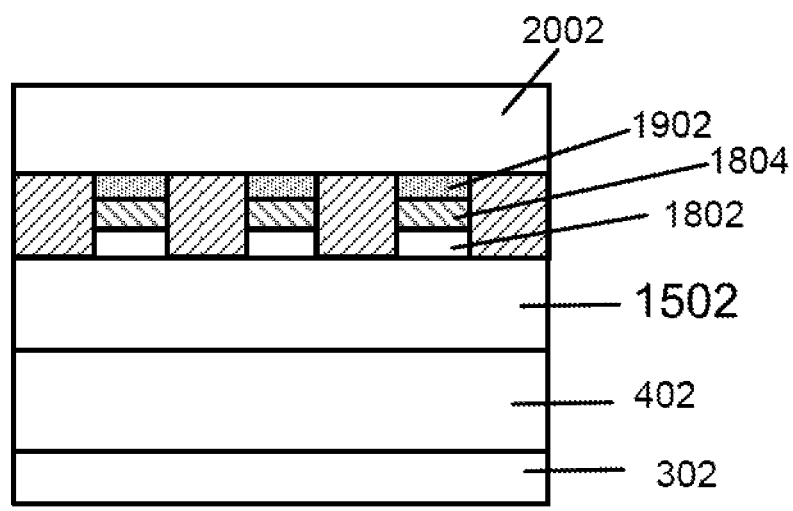
Figure 21:
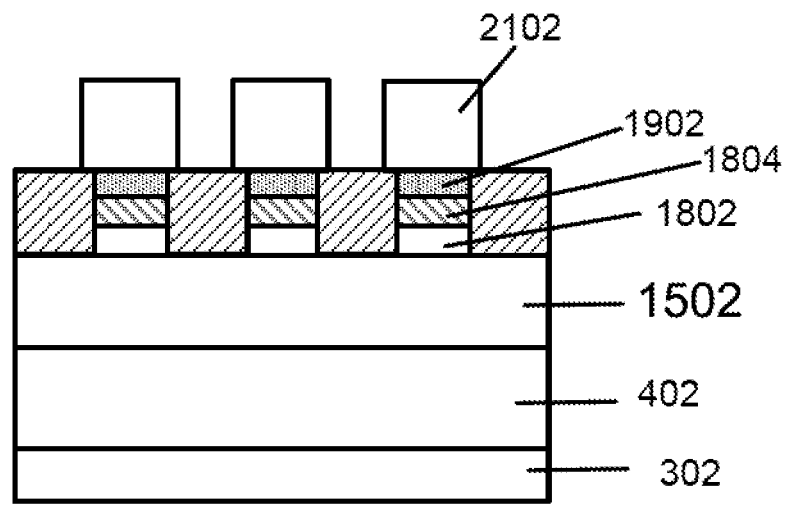

The method selectively forms a metal material 1902 in a portion of the via opening overlying the amorphous silicon material as shown in FIG. 19. As was described above, a thin layer of silicon oxide or other insulator may be disposed on top of the amorphous silicon material prior to the metal material 1902 being deposited. A second wiring material 2002 is formed overlying the metal material as shown in FIG. 20. The second wiring material is subjected to a patterning and etch process to form a plurality of second wiring structure 2102 as shown in FIG. 21. As shown the second wiring structure is spatially configured to extend in a second direction orthogonal to the first direction in a specific embodiment.

Figure 22:
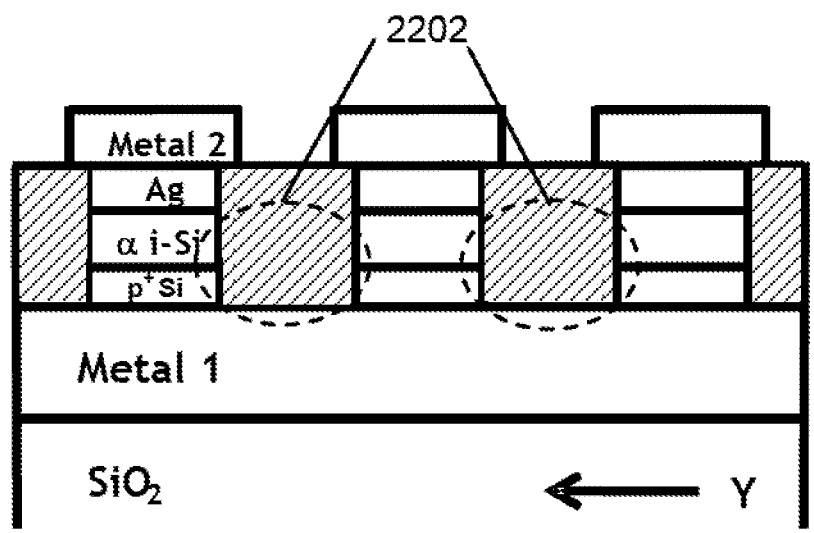

FIG. 22 is a simplified cross section view of the non-volatile memory device from the second direction. As shown, as the switching material and the contact material are isolated by portions of the second dielectric material 2202, disturb between neighboring devices from leakage current or parasitic current is therefore prevented during operations of read, write or erase.

In a specific embodiment, a method of forming a non-volatile memory device is provided. The method includes providing a first cell and a second cell in an N by M array of interconnected crossbar structures. The first cell includes a first wiring structure extending in a first direction and a second wiring structure extending in a second direction. The first direction and the second direction are at angle to each other. In a specific embodiment, the first wiring structure is configured to be orthogonal to the second wiring structure, forming a crossbar structure. In a specific embodiment, the first cell includes a contact material overlying the first wiring structure and a switching material overlying the contact material. In a specific embodiment, the contact material can be a p+ polysilicon material and the switching material can include an amorphous silicon material. In a specific embodiment, the first call includes a first amorphous silicon switching region disposed in an intersecting region between the first wiring structure and the second wiring structure. In a specific embodiment, the second cell is formed from the first wiring structure, the switching material, the contact material, and a third wiring structure. The third wiring structure is parallel to the second wiring structure and separated from the second wiring structure in a specific embodiment. In a specific embodiment, a second switching region is dispose in an intersecting region between the first wiring structure and the third wiring structure. At least the switching material and the contact material form a coupling between the first cell and the second cell. The coupling is eliminated by disposing the switching material in a first via structure for the first cell and a second via structure for the second cell. The first via structure and the second via structure are formed in portions of a dielectric material isolated by the dielectric material to electrically and physically isolate at least the first switching region and the second switching region. The dielectric material prevents disturb and crosstalk between the first cell and the second cell when one of the cells is selected in each of the programming, writing, reading or erase cycles in a specific embodiment as illustrated in FIGS. 14*a* and 22.

In a specific embodiment, a non-volatile memory device is provided. The device includes a substrate having a surface region. A first dielectric material overlying the surface region of the semiconductor substrate. The device includes at least a first cell and a second cell. The first cell and the second cell are provided in an array of N by M interconnected crossbar structure in a specific embodiment. The first cell includes a first wiring structure extending in a first direction overlying the first dielectric material, a first contact region comprising a p+ polysilicon material, a first switching region comprising an amorphous silicon material, and a second wiring structure extending in a second direction orthogonal to the first direction in a specific embodiment. The second cell includes the first wiring structure, a second contact region comprising the p+ polysilicon material, a second switching region comprising the amorphous silicon material, and a third wiring structure. The third wiring structure is separated from the second wiring structure and spatially parallel to the second wiring structure in a specific embodiment. In a specific embodiment, at least the first switching region is configured in a first via structure and at least the second switching region is configured in a second via structure. The first via structure and the second via structure are disposed in portions of a dielectric material. The dielectric material electrically and physically isolate at least the first switching region from the second switching region and prevents cross talk and disturbs between the first cell and the second cell when one of the cells is selected in each of the programming, writing, reading or erase cycles as illustrated in FIGS. 14*a* and 22.

In another embodiment, A non-volatile memory device structure includes a substrate having a surface region; a first dielectric material overlying the surface region of the semiconductor substrate; a first cell, the first cell comprising a first wiring structure extending in a first direction overlying the first dielectric material, a second wiring structure spatially extending in a second direction orthogonal to the first direction, a first contact region comprising a p+ polysilicon material and a first switching region comprising an amorphous silicon material disposed in a first via structure in a portion of a second dielectric material and in an intersection region between the first wiring structure and the second wiring structure; and a second cell, the second cell comprising the first wiring structure and a third wiring structure separated from the second wiring structure and parallel to the second wiring structure, a second contact region comprising the p+ polysilicon material, a second switching region comprising the amorphous silicon material disposed in a second via structure in a second portion of the second dielectric material, the first via structure comprising the first contact region and the first switching region being physically and electrically isolate from the second via structure comprising the second contact region and the second switching region.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A method of forming a non volatile memory device, comprising:
   providing a substrate having a surface region;
   forming a first dielectric material overlying the surface region of the semiconductor substrate;
   forming a first wiring material overlying the first dielectric material;
   forming a contact material comprising a doped polysilicon material overlying the first wiring material;
   subjecting the first wiring material and the contact material to a first patterning and etching process to separating a first strip of material from a second strip of material, each of the first strip of material and the second strip of material comprising the first wiring material and the contact material, the first strip of material and the second strip of material being spatially elongated in a first direction;
   forming a thickness of a second dielectric material overlying the first strip of material, the second strip of material, and filling a gap region between the first strip of material and the second strip of material;
   forming a first opening and a second opening in a portion of the thickness of the second dielectric material overlying the first strip of material, forming a third opening and a fourth opening in a portion of the thickness of the second dielectric material overlying the second strip of material, and exposing a respective surface region of the contact material;
   depositing a switching material comprising an undoped amorphous silicon material overlying the thickness of second dielectric material and to at least partially fill a first portion of the first opening, the second opening, the third opening, and the fourth opening, wherein the undoped amorphous silicon material is substantially free of dopants;
   subjecting the switching material to an etch back process to remove switching material overlying the second dielectric material while maintaining switching material in the first opening, the second opening, the third opening, and the fourth opening;
   depositing a metal material overlying the switching material to at least partially fill a second portion of the first opening, the second opening, the third opening, and the fourth opening; and
   forming a second wiring material overlying metal material in the first opening, the second opening, the third opening, and the fourth opening.

2. The method of claim 1 further comprises subjecting the second wiring material to a second patterning and etching process to form a third wiring structure overlying the metal material in the first opening and the third opening, and a fourth wiring structure overlying the metal material in the second opening and the fourth opening, the third wiring structure and the fourth wiring structure being spatially elongated in a second direction orthogonal to the first direction.

3. The method of claim 2 further comprises forming a third dielectric material overlying the third wiring structure and the fourth wiring structure to laterally isolate the third wiring structure from the fourth wiring structure.

4. The method of claim 1 wherein switching material in the first portion of the first opening forms a first switching element for a first switching device, and wherein switching material in the first portion of the second opening forms a second switching element for a second switching device.

5. The method of claim 4 wherein the second dielectric material isolates the first switching element from the second switching element to reduce disturbance of the second switching device during programming of the first switching device.

6. The method of claim 1 wherein the substrate is selected from a group consisting of: a single crystal silicon material, a silicon on germanium material, a silicon on insulator (SOI); and
   wherein the semiconductor substrate comprises one or more transistor devices formed thereon, the one or more transistor devices being operable coupled to the memory device.

7. The method of claim 1 wherein the first dielectric material is selected from a group consisting of: silicon oxide, silicon nitride, silicon oxide on silicon nitride on silicon oxide stack, a high K dielectric material, a low K dielectric material, or a combination thereof.

8. The method of claim 1 wherein the first wiring material is selected from copper, tungsten, and aluminum.

9. The method of claim 1 wherein an insulating layer is disposed between and in physical contact with both the metal material and the switching material, and wherein the insulating layer has a thickness within the range of approximately 20 Å to approximately 50 Å.

10. The method of claim 1 wherein the metal material is selected from a groups consisting of: silver, gold, nickel, platinum, palladium, aluminum, vanadium, and zinc.

11. The method of claim 1 wherein the contact material reduces formation of an interfacial region between the switching material and the first wiring material.

12. The method of claim 1 wherein the metal material forms a metal region derived from metal material in a portion of the switching material upon application of a voltage potential applied between the first wiring structure and the second wiring structure.

13. The method of claim 12 wherein the voltage potential is a positive voltage applied to the second wiring structure with respect to the first wiring structure.

14. The method of claim 12 wherein the metal region comprises a plurality of metal particles, the metal particles comprising metal ions, and wherein the metal region further comprises a filament structure characterized by a length and a distance between metal particles.

15. The method of claim 1, wherein the doped polysilicon material is p-type.

16. A method of forming a disturb-resistant non volatile memory device, comprising:
   providing a first cell and a second cell, the first cell being formed from a first wiring structure extending in a first direction and a second wiring structure extending in a second direction orthogonal to the first direction, a switching material comprising an amorphous silicon material, and a contact material comprising a p+ polysilicon material, a first switching region formed in an intersecting region between the first wiring structure and the second wiring structure, the second cell being formed from the first wiring structure, the switching material, the contact material, and a third wiring structure, the third wiring structure being parallel to the second wiring structure, a second switching region being formed in an intersecting region between the first wiring structure and the third wiring structure, at least the switching material and the contact material forming a coupling between the first cell and the second cell; and
   eliminating the coupling by disposing the switching material in a first via opening associated with the first cell and in a second via opening associated with the second cell, the first via opening and the second via opening being isolated using a dielectric material to electrically and physically isolate the first switching region and the second switching region;
   wherein amorphous silicon material is substantially free of dopants.

17. The method of claim 16 wherein the first cell and the second cell are provided in an N by M interconnected crossbar array.

18. The method of claim 16 wherein eliminating the coupling further includes disposing the contact material in each of the first via opening and the second opening.

* * * * *